(12) United States Patent
Yoshitsugu et al.

(10) Patent No.: US 7,648,917 B2
(45) Date of Patent: Jan. 19, 2010

(54) MANUFACTURING METHOD OF SOLID-STATE IMAGING DEVICE

(75) Inventors: Kai Yoshitsugu, Nagasaki (JP); Kenichi Chiba, Nagasaki (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/857,590

(22) Filed: Sep. 19, 2007

(65) Prior Publication Data

US 2008/0081394 A1    Apr. 3, 2008

(30) Foreign Application Priority Data

Sep. 28, 2006   (JP) .............................. 2006-263982

(51) Int. Cl.
  *H01L 21/44* (2006.01)
  *H01L 21/301* (2006.01)
  *H01L 21/461* (2006.01)
(52) U.S. Cl. ...................... 438/721; 438/664; 438/682; 438/755; 257/368; 257/382; 257/384
(58) Field of Classification Search ................. 438/664, 438/721, 755, 630, 682; 257/368, 382, 384
See application file for complete search history.

(56) References Cited

U.S. PATENT DOCUMENTS

| 5,880,497 | A  | * | 3/1999  | Ikeda et al. ................. 257/298 |
| 6,774,441 | B2 | * | 8/2004  | Maki et al. ................... 257/384 |
| 7,126,174 | B2 | * | 10/2006 | Segawa et al. ............... 257/288 |
| 2006/0121640 | A1 | * | 6/2006 | Kim ............................. 438/57 |
| 2007/0090465 | A1 | * | 4/2007 | Suzuki et al. ............... 257/369 |

FOREIGN PATENT DOCUMENTS

| JP | 08-045926 | 2/1996 |
| JP | 09-008292 | 1/1997 |

(Continued)

OTHER PUBLICATIONS

A Japanese Office Action dated Oct. 21, 2008 issued in connection with counterpart Japanese Patent Application No. 2006-263982.

(Continued)

*Primary Examiner*—David Vu
*Assistant Examiner*—Arman Khosraviani
(74) *Attorney, Agent, or Firm*—Sonnenschein Nath & Rosenthal LLP

(57) ABSTRACT

A manufacturing method of a solid-state imaging device includes: forming a first and second insulating films having different properties on a silicon substrate such that they cover sides of gate electrodes formed on the silicon substrate; subjecting the second insulating film to selective etching, and forming sidewalls on the sides of the gate electrode; subjecting the gate electrode having the sidewalls formed to ion implantation; covering the gate electrode having the sidewalls formed and forming a third insulating film on the silicon substrate; covering with a mask material part of the gate electrodes covered with the third insulating film, and subjecting the substrate to etching to remove exposed third insulating film; and, after removing the mask material, forming a metal film capable of forming a silicide on the silicon substrate such that the metal film covers the gate electrodes and the third insulating film to form a silicide layer.

5 Claims, 6 Drawing Sheets

FOREIGN PATENT DOCUMENTS

| | | |
|---|---|---|
| JP | 11-026746 | 1/1999 |
| JP | 2000-294773 | 10/2000 |
| JP | 2001-111022 | 4/2001 |
| JP | 2005-174968 | 6/2005 |
| JP | 2006-073885 | 3/2006 |

OTHER PUBLICATIONS

Japanese Office Action issued on Feb. 24, 2009 corresponding to JP Patent Application No. 2006-263982.

* cited by examiner

PERIPHERAL REGION

PIXEL REGION

US 7,648,917 B2

MANUFACTURING METHOD OF SOLID-STATE IMAGING DEVICE

CROSS REFERENCES TO RELATED APPLICATIONS

The present application contains subject matter related to Japanese Patent Application JP 2006-263982 filed in the Japanese Patent Office on Sep. 28, 2006, the entire contents of which being incorporated herein by reference.

BACKGROUND OF THE INVENTION

1. Field of the Invention

The present invention relates to a manufacturing method of a solid-state imaging device. More particularly, the present invention is concerned with a manufacturing method of a solid-state imaging device having a transistor having a silicide layer formed.

2. Description of Related Art

In related art, as solid-state imaging devices that convert image light to an electric signal as an image signal, a charge coupled device (CCD) image sensor, a metal oxide semiconductor (MOS) image sensor, and others have been known.

The MOS image sensor has, on a common substrate, a photo-detection region (photodiode) which generates charges in response to light irradiation, and a voltage conversion region which converts the charges generated by the photo-detection region to an electric signal (generally, a voltage signal). In the photo-detection region, pixel transistors (MOS transistors) are formed, and in the voltage conversion region peripheral transistors (MOS transistors) are formed.

The solid-state imaging device tends to be driven at a higher speed in recent years, and, in accordance with this tendency, there are increasing demands for the peripheral transistor having a higher driving speed. For meeting such demands and improving the operation speed of the peripheral transistor, a technique is widely used by which a silicide layer, which is a compound of Si and a high melting-point metal such as Ti, Co, or Ni is formed on the surfaces of the gate electrode, a source region, and a drain region of the peripheral transistor (for example, see Japanese Patent Application Publication No. 2005-174968).

An explanation is made below on a related art manufacturing method of a solid-state imaging device having a peripheral transistor in which a silicide layer is formed in the voltage conversion region (hereinafter, referred to as "a peripheral region").

In a related art manufacturing method of a solid-state imaging device, first, as shown in FIG. 4A, a first silicon oxide film 104 and a silicon nitride film 105 for forming sidewalls of a peripheral transistor are formed by a low pressure chemical vapor deposition (CVD) method on the entire surface (both the pixel region and the peripheral region) so that they cover a gate electrode 103 formed on a gate oxide film 102 formed by thermal oxidation on the surface of a silicon substrate 101.

Furthermore, using a general-purpose photolithography technique, the pixel region is covered with a photoresist 106 (see FIG. 4B), and the resultant silicon substrate is subjected to dry etching in a state such that the pixel region is covered with the photoresist, forming sidewalls 107 on the sides of the gate electrode in the peripheral region (see FIG. 4C).

Subsequently, the photoresist is removed, and a second silicon oxide film 108 for forming sidewalls of a pixel transistor and a peripheral transistor is formed on the entire surface (both the pixel region and the peripheral region) by a low pressure CVD method (see FIG. 4D), followed by dry etching, forming sidewalls 107 on the sides of the gate electrodes in the pixel region and the peripheral region (see FIG. 5A).

Using a general-purpose photolithography technique, the pixel region is covered with a photoresist 106, and the resultant silicon substrate is subjected to first ion implantation (see reference character A in the figure) in a state such that the pixel region is covered with the photoresist, forming a source region and a drain region so that they surround the gate electrode in the peripheral region (see FIG. 5B). The pixel region is covered with the photoresist, and hence circumference of the gate electrode in the pixel region is not subject to the first ion implantation.

Subsequently, the photoresist covering the pixel region is removed and then, using a general-purpose photolithography technique, the peripheral region is covered with a photoresist 106, and the resultant silicon substrate is subjected to second ion implantation (see reference character B in the figure) in a state such that the peripheral region is covered with the photoresist, forming a source region and a drain region so that they surround the gate electrode in the pixel region (see FIG. 5C). The peripheral region is covered with the photoresist, and hence circumference the gate electrode in the peripheral region is not subject to the second ion implantation.

Next, using a sputtering technique, a metal film 109 (e.g., a Co film) for forming a silicide is formed on the entire surface of the silicon substrate (see FIG. 6A), and the resultant silicon substrate is subjected to predetermined thermal treatment, forming a silicide layer 110 near the surface of the gate electrode, a source region, and a drain region of the peripheral transistor (see FIG. 6B).

Subsequently, a nitride film 113 containing a large amount of hydrogen is formed on the silicide layer. The nitride film containing a large amount of hydrogen supplies hydrogen to the silicon substrate, and causes diffusion of the hydrogen through the pixel region to reduce crystal defects in the pixel region (which is considered to reduce Si dangling bonds). Such a configuration is desirable when controlling the generation of white noises.

Subsequently, an interlayer dielectric 111 is formed, and contact holes 112 are formed, thus obtaining a pixel transistor having no silicide layer formed in the photo-detection region and a peripheral transistor having a silicide layer formed in the peripheral region (see FIG. 6C). In the figure, reference numeral 113 designates a photodiode region.

SUMMARY OF THE INVENTION

However, in the above-mentioned related-art manufacturing method of a solid-state imaging device, a silicon nitride film functions as an etching stopper (hereinafter, a film having such a function is referred to as "etching stopper") when sidewalls are formed on the sides of the gate electrodes of the pixel transistor and peripheral transistor (see FIG. 5A). Specifically, the silicon nitride film functions as a block film which prevents the metal film for forming a silicide from being in contact with the surfaces of the gate electrode and silicon substrate of the pixel transistor (hereinafter, a film having such a function is referred to as "block film"). There may be a case where the metal penetrates from the metal film for forming a silicide to the silicon substrate, which is considered as a cause of defect in the photo-detection region and form the metal at the energy level of silicon to cause electron emission or absorption, thus generating a luminescent spot on the screen, leading to a so-called white noise.

In other words, it is considered that the silicon nitride film which serves as an etching stopper suffers damage upon etching and has a penetration passage 114 for heavy metal, and hence cannot fully serve as a block film, so that the metal penetrates from the metal film for forming a silicide to the silicon substrate (see FIG. 6A). In the figure, the penetration passage 114 is shown as a linear and thick line path representing a hole formed in the films for an easy understanding. However, in actual cases, the penetration passage is rarely a hole. The penetration passage is generally formed as a continuous or intermittent lattice defect, and it is often so fine that it cannot be recognized as a continuous path in the silicon nitride film which has just been formed. In practice, a metal enters into the lattice defect portion during the process for production and the lattice defect portion causes diffusion of the metal to progress from the surface of the silicon nitride film to the silicon substrate, and failures, such as a white noise or the like, are found in the final product test or the like, which eventually reveals that a path is present in the silicon nitride film.

For resolving such an issue, a method is proposed in which the silicon nitride film is used as an etching stopper and then the silicon nitride film is removed by etching, and then another silicon nitride film is formed again as a block film. In this method, it is not necessary to use the damaged etching stopper as a block film. However, an interface is formed at the boundary region between the etching stopper positioned under the sidewall of the pixel transistor and the block film newly formed, and there is a possibility that the metal penetrates through the interface from the metal film for forming a silicide to the silicon substrate, and therefore this method may not be adequate.

In view of the above issues, it is desirable to provide a manufacturing method of producing a solid-state imaging device, which allows to reduce penetration of metal from a silicide-forming metal film to a silicon substrate due to metal diffusion and to control white noise.

According to an embodiment of the present invention, there is provided a manufacturing method of a solid-state imaging device. The method includes: forming a first insulating film and a second insulating film on a silicon substrate such that they cover sides of a plurality of gate electrodes formed on the silicon substrate, the first and second insulating films having different etching properties from each other; subjecting the second insulating film to selective etching, and forming sidewalls on the sides of the gate electrode; subjecting the gate electrode having the sidewalls formed to ion implantation; covering the gate electrode having the sidewalls formed and forming a third insulating film on the silicon substrate; covering with a mask material part of the plurality of gate electrodes covered with the third insulating film, and subjecting the resultant substrate to etching to remove exposed third insulating film; and after removing the mask material, forming a metal film capable of forming a silicide on the silicon substrate such that the metal film covers the gate electrodes and the third insulating film, and effecting silicide formation to form a silicide layer.

In the present embodiment, the second insulating film is subjected to selective etching to form sidewalls on the sides of each gate electrode, and a third insulating film is formed on the silicon substrate such that it covers each gate electrode having the sidewalls formed. Furthermore, a metal film capable of forming a silicide is formed on the silicon substrate such that it covers the gate electrodes and third insulating film. Accordingly, the metal film can be formed on the third insulating film to which substantially no stress is applied, allowing the third insulating film to adequately function as the block film and making it possible to reduce penetration of impurity metal.

DETAILED DESCRIPTION OF EMBODIMENTS

Hereinbelow, an embodiment of the present invention will be described with reference to the accompanying drawings for explaining the present invention.

FIGS. 1A to 1D are diagrammatic views for explaining an example of a manufacturing method of a solid-state imaging device according to an embodiment of the present invention. In the present embodiment, first, in the same manner as in the above-mentioned related art manufacturing method of a solid-state imaging device, a silicon oxide film 4 (which is an example of the first insulating film) for forming sidewalls of a transistor is formed on the entire surface (both the pixel region and the peripheral region) such that it covers a gate electrode 3 formed on a gate oxide film 2 formed (by fine thermal oxidation in the present embodiment) on the surface of a silicon substrate 1 (see FIG. 1A). From the viewpoint of achieving excellent coating property, it is preferable that the silicon oxide film is formed by a low pressure CVD method. When a transistor having a lightly doped drain (LDD) structure is obtained, it is necessary to perform impurity implantation and an activation treatment, such as annealing, before forming the silicon oxide film.

In the present embodiment, a description of manufacturing method of the silicon substrate having a gate oxide film formed thereon is omitted. The manufacturing method of the silicon substrate having a gate oxide film formed thereon is similar to that in the manufacturing method of a typical MOS sensor.

Figure 1A:
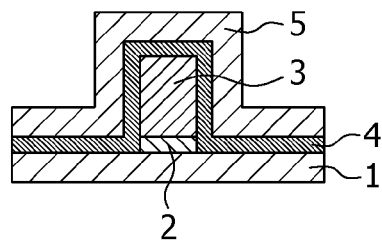
FIGS. 1A to 1D are diagrammatic views (No. 1) for explaining a manufacturing method of a solid-state imaging device according to an embodiment of the present invention.
Figure 1A:
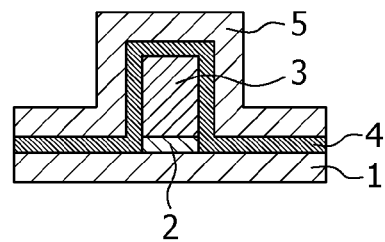

After the silicon oxide film is formed, a silicon nitride film 5 (which is an example of the second insulating film) is formed on the entire surface (both the pixel region and the peripheral region) by a low pressure CVD method (see FIG. 1A). The film type of the silicon nitride film need to be changed so that the silicon nitride film has a high etching selective ratio in the below-mentioned dry etching, as compared to the silicon oxide film, and the thickness of each film is appropriately selected depending on the sidewall width required for the transistor.

Figure 1B:
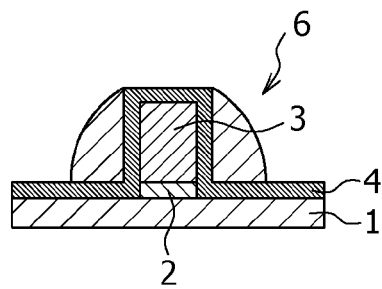
Figure 1B:
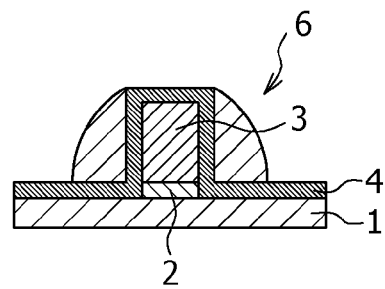

Subsequently, the whole surface of the silicon nitride film is subjected to dry etching, forming sidewalls 6 on the sides of each gate electrode in the pixel region and the peripheral region (see FIG. 1B). In this instance, the etching conditions are controlled so that the silicon nitride film has a high etching selective ratio, as compared to the silicon oxide film, making it possible to minimize etching for the silicon oxide film and etching damage on the silicon substrate.

In the present embodiment, the silicon oxide film and silicon nitride film having different etching properties are formed on the silicon substrate, and the silicon oxide film is used as an etching stopper. Therefore, transistors having the same sidewall structure can be formed in the pixel region and the peripheral region, and hence the number of steps in the process can be reduced, as compared to that in the related art manufacturing method of a solid-state imaging device.

Specifically, in the related art solid-state imaging device, the transistor formed in the pixel region and the transistor formed in the peripheral region have different structures, and therefore, a step for covering the pixel region with a photoresist is required for etching the peripheral region and a step for covering the peripheral region with a photoresist is required for etching the pixel region. By contrast, in the present embodiment, transistors having the same sidewall structure are formed in the pixel region and the peripheral region.

Figure 1C:
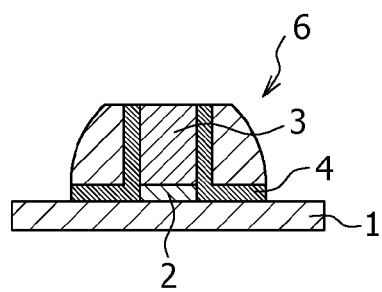
Figure 1C:
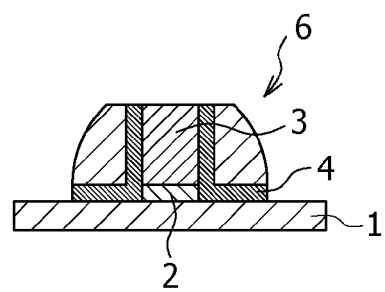

Subsequently, the silicon oxide film is subjected to wet etching, so that the exposed silicon oxide film is etched away (see FIG. 1C).

In the present embodiment, the silicon oxide film is removed by wet etching, which causes smaller damage on the silicon substrate, as compared to dry etching.

Figure 1D:
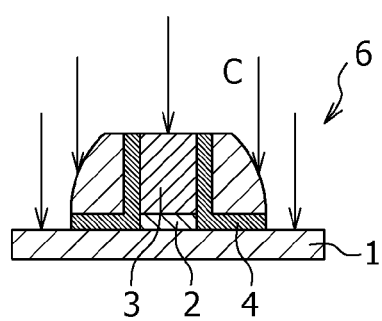
Figure 1D:
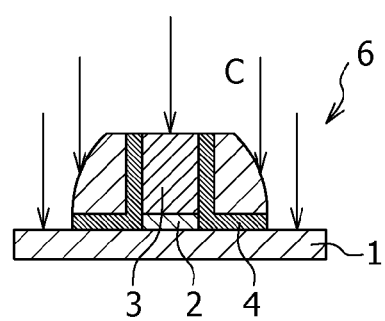

Next, the silicon substrate is subjected to ion implantation (see reference character C in the figure), to form a source region and a drain region so that they surround the gate electrodes in the pixel region and the peripheral region (see FIG. 1D).

In the present embodiment, the pixel region and the peripheral region can share a common step for ion implantation, and therefore the number of steps in the process can be reduced, as compared to that in the related art manufacturing method of a solid-state imaging device.

Specifically, in the related art solid-state imaging device, with respect to the pixel region, the silicon substrate is subjected to ion implantation through the first silicon oxide film and silicon nitride film, and, with respect to the peripheral region, the silicon substrate is subjected to direct ion implantation without any film. Therefore, the energy of ion implantation for the pixel region is different from that for the peripheral region. For this reason, ion implantation for the pixel region and ion implantation for the peripheral region are performed individually. By contrast, in the present embodiment, with respect to each of the pixel region and the peripheral region, the silicon substrate can be directly subjected to ion implantation (without going-through a film). Therefore, the pixel region and the peripheral region can share the common step for ion implantation, thus enabling to reduce the number of steps in the process.

Since the pixel region and the peripheral region can share the common step for ion implantation, non-uniform ion implantation may be avoided, thereby making it possible to obtain a high quality solid-state imaging device.

Furthermore, in the present embodiment, the silicon oxide film is removed by etching prior to the step for ion implantation. Therefore, ion concentration during the ion implantation can be controlled with high precision, thus making it possible to obtain a high quality solid-state imaging device. Specifically, the silicon oxide film which serves as an etching stopper is necessary to be removed by forming of the below-mentioned metal film for forming a silicide, and it is not always necessary to remove it by etching prior to the step for ion implantation. However, in the present invention, the silicon oxide film is removed by etching prior to the step for ion implantation such that the silicon substrate can be directly subjected to ion implantation (through no film). Such a configuration allows the precise control of ion concentration during the ion implantation.

Figure 2A:
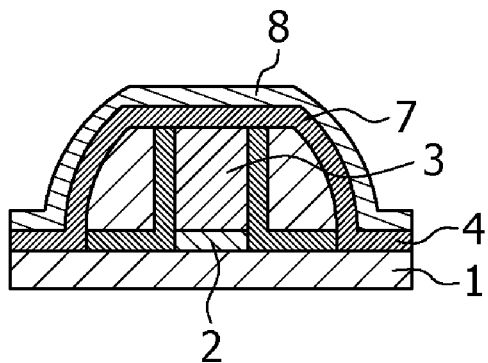
FIGS. 2A to 2C are diagrammatic views (No. 2) for explaining the manufacturing method of a solid-state imaging device according to an embodiment of the present invention.
Figure 2A:
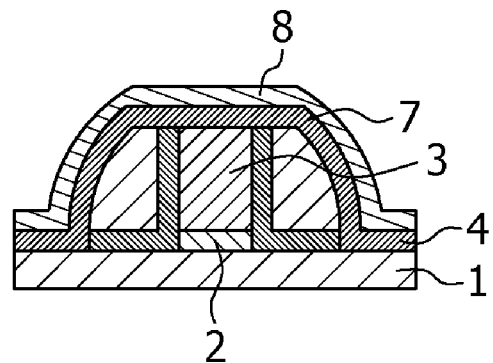

Subsequently, a plasma silicon nitride film 7 is formed on the entire surface of the silicon substrate by a CVD method, and a silicon nitride film (LP-silicon nitride film) 8 is formed on the plasma silicon nitride film by a low pressure CVD method (see FIG. 2A). Each of the plasma silicon nitride film and the LP-silicon nitride film in the present embodiment is an example of the third insulating film, and the plasma silicon nitride film is also an example of the hydrogen supply layer.

The plasma silicon nitride film contains hydrogen owing to its formation step, and hence supplies hydrogen to the silicon substrate and causes diffusion of hydrogen through the pixel region to reduce crystal defects in the pixel region (which is considered to reduce Si dangling bonds), thus enabling controlling or suppressing of the generation of white noises.

The plasma silicon nitride film formed for controlling the generation of white noise is tend to be easily etched. In the present embodiment, for protecting the plasma silicon nitride film, the LP-silicon nitride film is formed on the plasma silicon nitride film.

In the above-mentioned steps, the transistor formed in the pixel region and the transistor formed in the peripheral region have completely the same structure, and therefore the common manufacturing method is used for both the pixel region and the peripheral region.

Figure 2B:
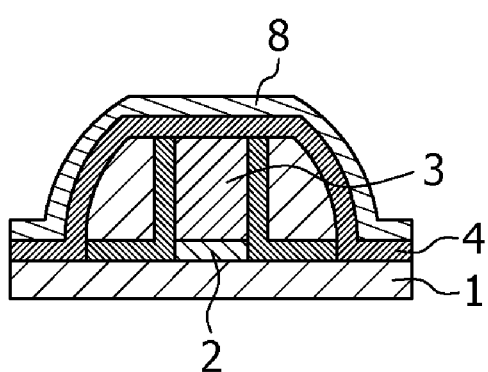
Figure 2B:
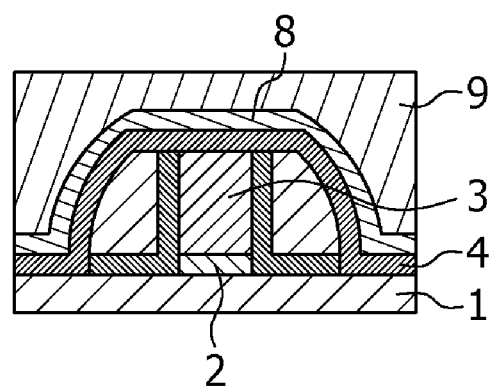
Figure 2C:
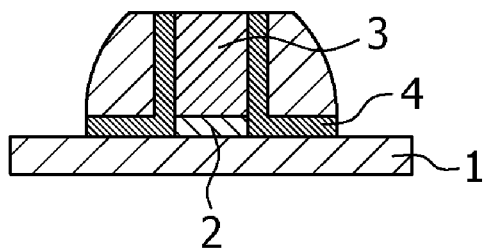
Figure 2C:
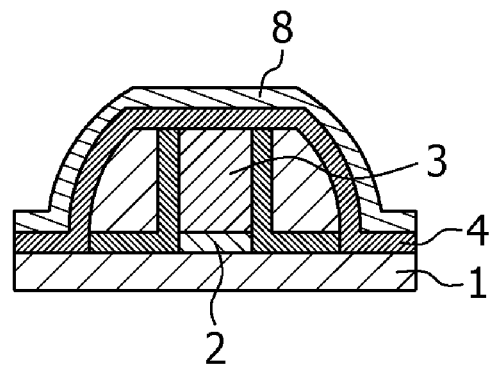

Next, using a general-purpose photolithography technique, the pixel region is covered with a photoresist 9 (see FIG. 2B), and the resultant silicon substrate is subjected to dry etching in a state such that the pixel region is covered with the photoresist, so that the plasma silicon nitride film and LP-silicon nitride film formed in the peripheral region are etched away (see FIG. 2C).

Figure 3A:
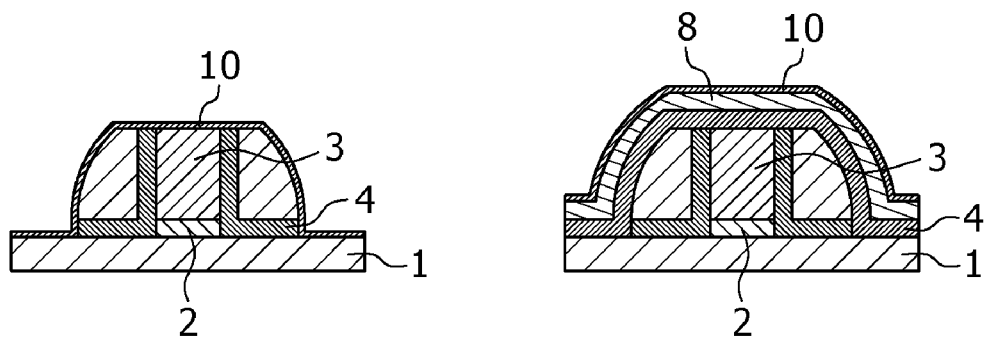
FIGS. 3A to 3C are diagrammatic views (No. 3) for explaining the manufacturing method of a solid-state imaging device according to an embodiment of the present invention.
Figure 3B:
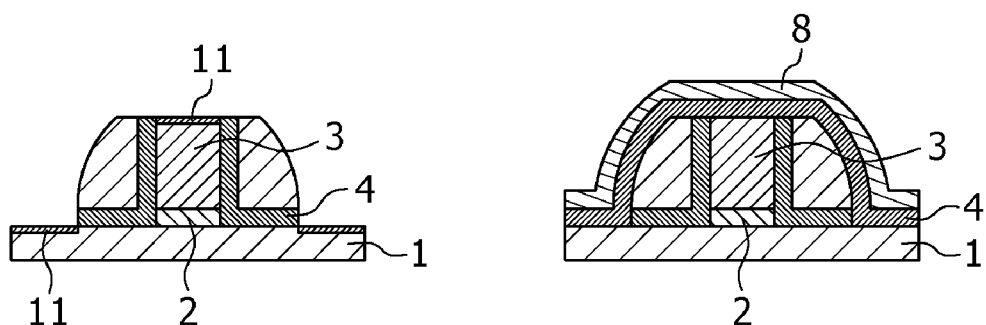

Subsequently, the photoresist is removed, and, using a sputtering technique, a metal film 10 (e.g., a Co film) for forming a silicide is formed on the entire surface of the silicon substrate (see FIG. 3A). The resultant silicon substrate is subjected to predetermined thermal treatment, forming a silicide in the region from which the plasma silicon nitride film and LP-silicon nitride film are removed. On the other hand, in the other region (the region in which the plasma silicon nitride film and LP-silicon nitride film are formed), a silicide is not formed since the fine outermost surface of the LP-silicon nitride film serves as a block film. In other words, a silicide layer 11 is formed near surfaces of the gate electrode, a source region and a drain region of the peripheral transistor (see FIG. 3B).

In the present embodiment, the LP-silicon nitride film serves as the block film, and therefore the penetration of metal from the metal film to the silicon substrate can be prevented.

Specifically, in the manufacturing method of a related art solid-state imaging device, the silicon nitride film which serves as the etching stopper is used as the block film, and hence the silicon nitride film cannot fully serve as the block film due to damage caused upon etching. By contrast, in the present embodiment, the silicon oxide film serves as the etching stopper and the LP-silicon nitride film serves as the block film. In other words, a film which serves as the etching stopper and a film which serves as the block film are formed independently. Therefore the LP-silicon nitride film can fully function as the block film, thereby preventing penetration of metal from the metal film to the silicon substrate.

Subsequently, the unreacted metal film is removed by a chemical treatment, and a nitride film 15 containing a large amount of hydrogen is formed on the silicide layer. The nitride film containing a large amount of hydrogen supplies hydrogen to the silicon substrate, and causes diffusion of hydrogen through the pixel region to reduce crystal defects in the pixel region (which is considered to reduce Si dangling bonds), thus controlling the generation of white noise.

Figure 3C:
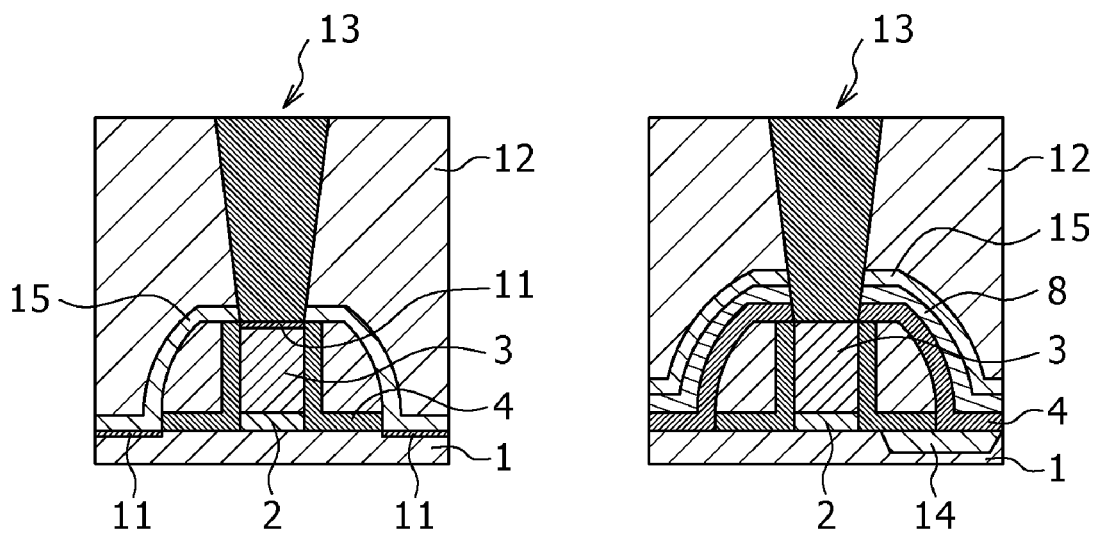
Figure 4A:
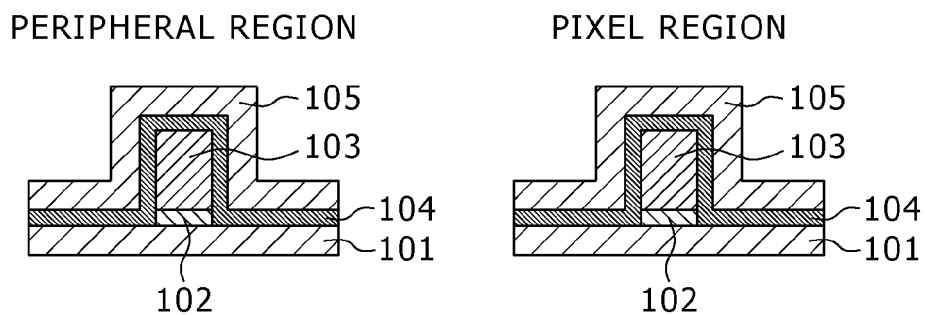
FIGS. 4A to 4D are diagrammatic views (No. 1) for explaining a manufacturing method of a solid-state imaging device of related art.
Figure 4B:
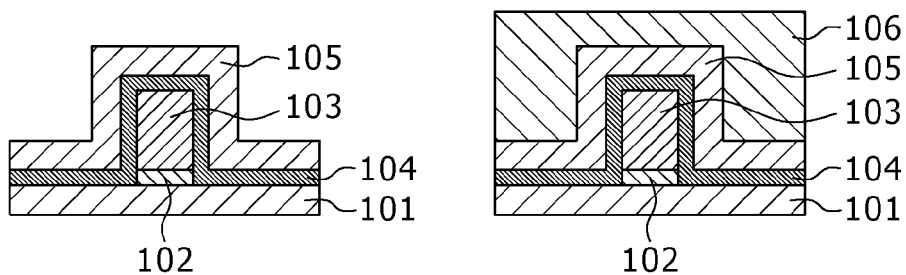
Figure 4C:
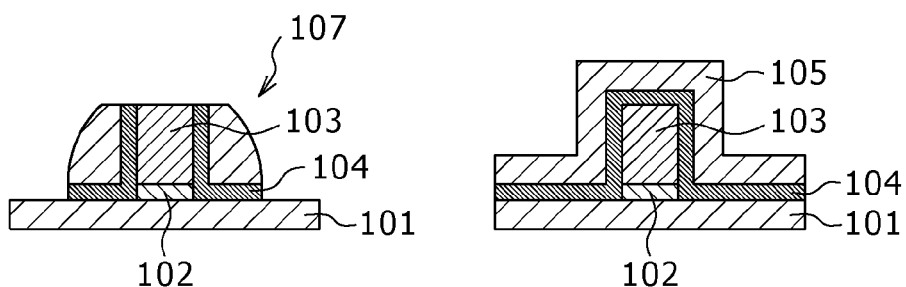
Figure 4D:
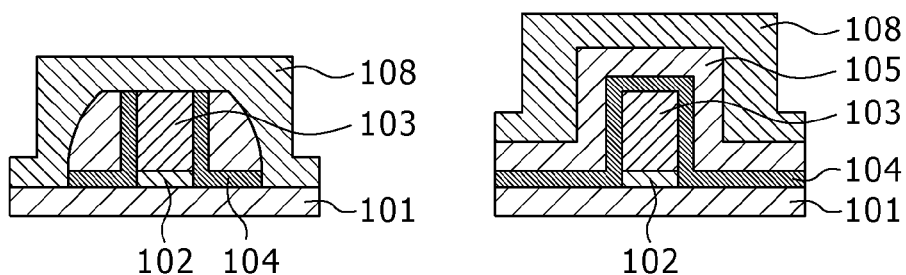
Figure 5A:
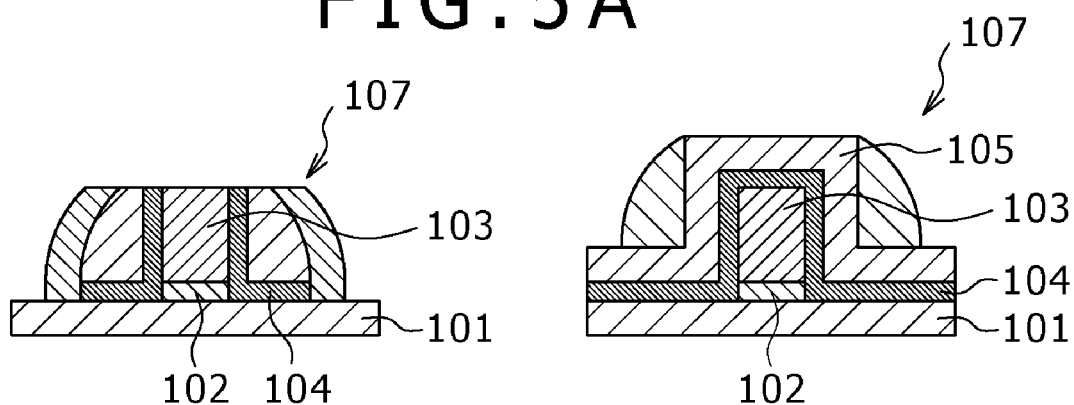
FIGS. 5A to 5C are diagrammatic views (No. 2) for explaining the manufacturing method of a solid-state imaging device of related art.
Figure 5B:
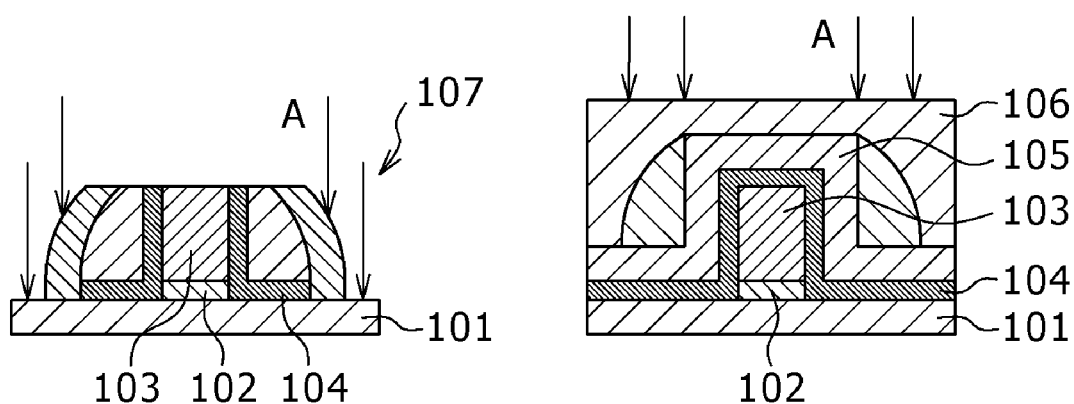
Figure 5C:
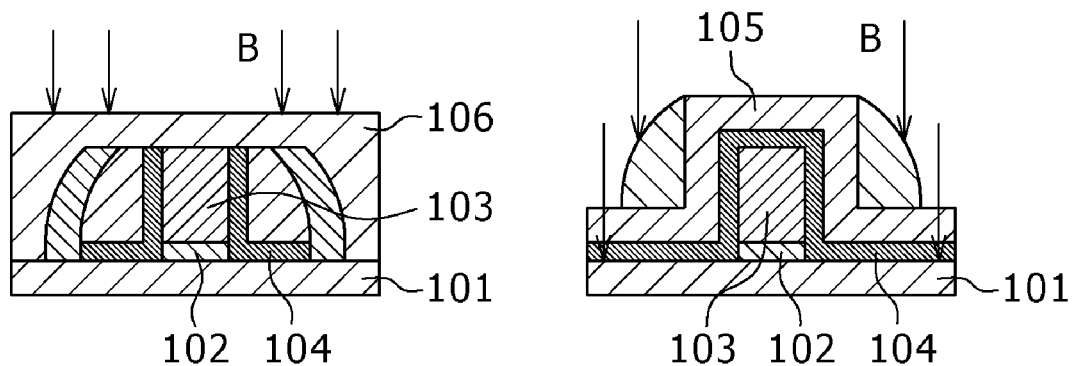
Figure 6A:
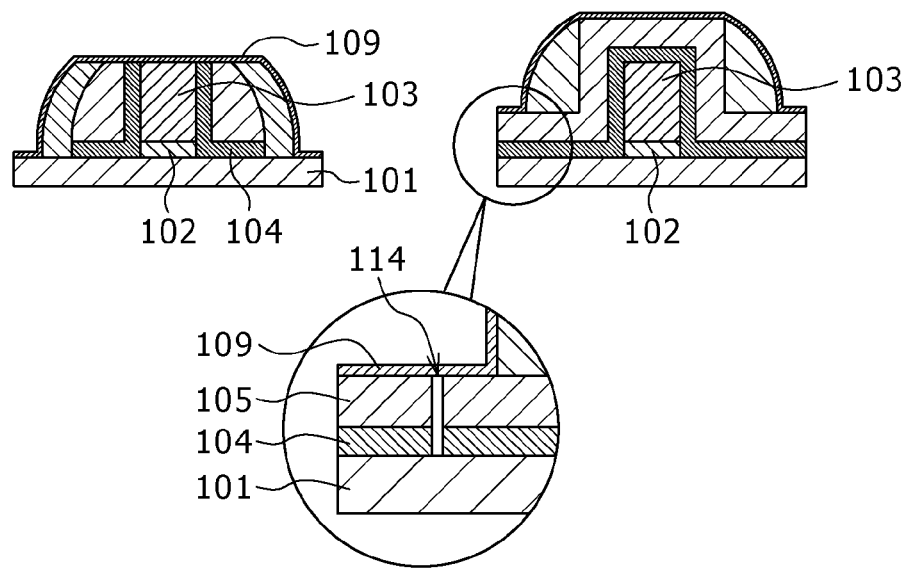
FIGS. 6A to 6C are diagrammatic views (No. 3) for explaining the manufacturing method of a solid-state imaging device of related art.
Figure 6B:
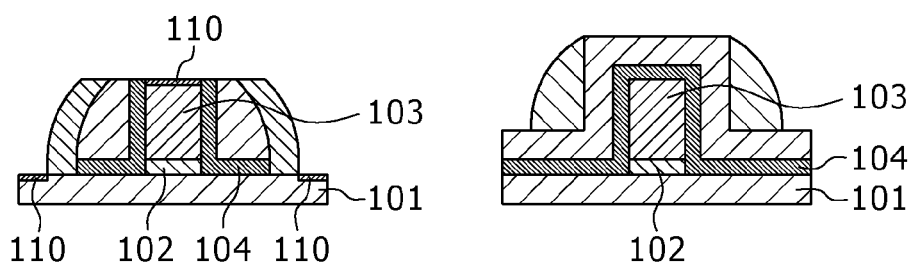
Figure 6C:
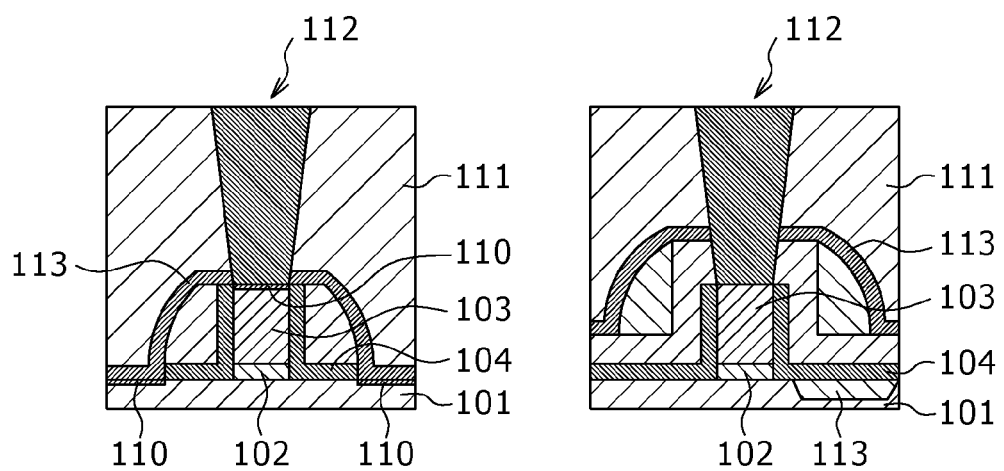

Next, an interlayer insulating film 12 is formed, and contact holes 13 are formed, thus obtaining a pixel transistor having no silicide layer formed in the pixel region and a peripheral transistor having a silicide layer formed in the peripheral region (see FIG. 3C). In the figure, reference numeral 14 designates a photodiode region.

In the above-described manufacturing method of a solid-state imaging device according to an embodiment of the present invention, the penetration of metal from the metal film to the silicon substrate can be controlled, so that the resultant solid-state imaging device controls white noises, thus achieving improvement in quality of the solid-state imaging device.

Further, the pixel region and the peripheral region share the common step for forming sidewalls or the common step for ion implantation, thereby achieving the manufacturing method of a solid-state imaging device having the reduced number of process steps.

In the manufacturing method of a solid-state imaging device of the present invention, the third insulating film can adequately function as the block film, enabling to reduce penetration of impurity metal from the metal film to the silicon substrate. Accordingly, it is possible to improve quality of a solid-state imaging device by controlling or suppressing so-called white noises.

It should be understood by those skilled in the art that various modifications, combinations, sub-combinations and alterations may occur depending on design requirements and other factors insofar as they are within the scope of the appended claims or the equivalents thereof.

What is claimed is:

1. A manufacturing method of a solid-state imaging device which has a pixel region and a peripheral region, said method comprising the steps of:

forming a first insulating film and a second insulating film on a silicon substrate having a pixel region and a peripheral region such that they cover sides of a gate electrode formed on the silicon substrate in the pixel region and sides of a gate electrode formed on the silicon substrate in the peripheral region, the first and second insulating films having different etching properties from each other;

subjecting the second insulating film to selective etching over both gate electrodes, and forming sidewalls on the sides of both of the gate electrodes;

subjecting the gate electrodes with the sidewalls in the peripheral region and the pixel region to ion implantation at the same time;

covering the gate electrodes with the sidewalls and the silicon substrate with a third insulating film;

covering the gate electrode with the sidewalls and the third insulting film in one of the regions with a mask material, and subjecting the resultant structure to etching to remove third insulating film not covered by the mask;

removing the mask material;

forming a metal film capable of forming a silicide over the gate electrodes with sidewalls and third insulating film; and effecting silicide formation to form a silicide layer from the silicide, wherein, the sidewalls of the gate electrodes in the pixel and peripheral regions are effectively the same in structure, and said step of forming a third insulating layer includes a first step of forming a plasma silicon nitride film and a second step of forming a low pressure silicon nitride film.

2. The manufacturing method of a solid-state imaging device according to claim 1, wherein: the selective etching of the second insulating film resulting in the formation of the sidewalls is dry etching.

3. The manufacturing method of a solid-state imaging device according to claim 1, wherein:

the ion implantation is performed after removing the first insulating film.

4. The manufacturing method of a solid-state imaging device according to claim 3, wherein: the first insulating film is removed by wet etching.

5. The manufacturing method of a solid-state imaging device according to claim 1, wherein: the third insulating film has a hydrogen supply layer in at least part thereof.

* * * * *